US010847242B2

(12) United States Patent
Baumann et al.

(10) Patent No.: US 10,847,242 B2
(45) Date of Patent: Nov. 24, 2020

(54) COMPUTING REGISTER WITH NON-VOLATILE-LOGIC DATA STORAGE

(71) Applicant: TEXAS INSTRUMENTS INCORPORATED, Dallas, TX (US)

(72) Inventors: Adolf Baumann, Haag (DE); Mark Jung, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 174 days.

(21) Appl. No.: 14/555,552

(22) Filed: Nov. 26, 2014

(65) Prior Publication Data

US 2016/0027511 A1 Jan. 28, 2016

Related U.S. Application Data

(60) Provisional application No. 62/028,119, filed on Jul. 23, 2014.

(51) Int. Cl.
*G11C 29/36* (2006.01)
*G11C 14/00* (2006.01)
*G11C 5/14* (2006.01)

(52) U.S. Cl.
CPC .......... *G11C 29/36* (2013.01); *G11C 14/0063* (2013.01); *G11C 5/148* (2013.01); *G11C 2029/3602* (2013.01)

(58) Field of Classification Search
CPC . G11C 16/0304; G11C 14/0018; G11C 5/148; G11C 14/0063; G11C 29/36; G11C 2029/3602
See application file for complete search history.

(56) References Cited

U.S. PATENT DOCUMENTS

| 7,639,056 | B2 | 12/2009 | Gururajarao et al. | |
|---|---|---|---|---|
| 8,797,783 | B1 | 8/2014 | Bartling | |
| 2005/0097266 | A1* | 5/2005 | Factor | G06F 11/1474 711/112 |
| 2006/0261926 | A1* | 11/2006 | Zimmerman | G06K 7/0008 340/10.1 |
| 2008/0072051 | A1* | 3/2008 | Kaabouch | G06F 21/556 713/176 |
| 2011/0066853 | A1* | 3/2011 | Engels | H04L 9/3271 713/168 |

(Continued)

OTHER PUBLICATIONS

Fujitsu Semiconductor, "Data-Processing FRAM 16k (2K×8) Bit Dual SPI", MB85RDP16LX, Oct. 2014, pp. 1-32.

*Primary Examiner* — Larry T MacKall
(74) *Attorney, Agent, or Firm* — Brian D. Graham; Charles A. Brill; Frank D. Cimino

(57) ABSTRACT

A digital system includes a non-volatile calculating register having a set of latches configured to perform a calculation. A set of non-volatile storage cells is coupled to the set of latches. Access detection logic is coupled to the calculating register and is operable to initiate a calculation of a next value by the calculating register each time the calculating register is accessed by an accessing module. The access detection logic is operable to cause the next value to be stored in the set of non-volatile storage cells at the completion of the calculation as an atomic transaction. After a power loss or other restore event, the contents of the calculating register may be restored from the non-volatile storage cells.

17 Claims, 6 Drawing Sheets

(56) References Cited

U.S. PATENT DOCUMENTS

| | | | | |
|---|---|---|---|---|
| 2011/0241842 A1* | 10/2011 | Kovacic | ............ | G06K 19/0702 340/10.1 |
| 2014/0075087 A1* | 3/2014 | Bartling | ................. | G06F 13/00 711/102 |

* cited by examiner

COMPUTING REGISTER WITH NON-VOLATILE-LOGIC DATA STORAGE

CLAIM OF PRIORITY UNDER 35 U.S.C. 119(e)

The present application claims priority to and incorporates by reference U.S. Provisional Application No. 62/028,119 filed Jul. 23, 2014, entitled "NON-DISRUPTIVE LINEAR FEEDBACK SHIFT REGISTER AND UP-/DOWN-COUNTER WITH NON-VOLATILE-LOGIC (NVL) BASED DATA STORAGE."

FIELD OF THE INVENTION

This invention generally relates to nonvolatile memory cells and their use in a system, and in particular, in combination with a computing register to provide a nonvolatile logic module.

BACKGROUND OF THE INVENTION

Many portable electronic devices such as cellular phones, digital cameras/camcorders, personal digital assistants, laptop computers, and video games operate on batteries. During periods of inactivity the device may not need to perform processing operations and may be placed in a power-down or standby power mode to conserve power. Power provided to a portion of the logic within the electronic device may be turned off in a low power standby power mode. However, presence of leakage current during the standby power mode represents a challenge for designing portable, battery operated devices. Data retention circuits such as flip-flops and/or latches within the device may be used to store state information for later use prior to the device entering the standby power mode. The data retention latch, which may also be referred to as a shadow latch or a balloon latch, is typically powered by a separate 'always on' power supply.

A known technique for reducing leakage current during periods of inactivity utilizes multi-threshold CMOS (MTCMOS) technology to implement a shadow latch. In this approach, the shadow latch utilizes thick gate oxide transistors and/or high threshold voltage ($V_t$) transistors to reduce the leakage current in standby power mode. The shadow latch is typically detached from the rest of the circuit during normal operation (e.g., during an active power mode) to maintain system performance. To retain data in a 'master-slave' flip-flop topology, a third latch, e.g., the shadow latch, may be added to the master latch and the slave latch for the data retention. In other cases, the slave latch may be configured to operate as the retention latch during low power operation. However, some power is still required to retain the saved state. For example, see U.S. Pat. No. 7,639,056, "Ultra Low Area Overhead Retention Flip-Flop for Power-Down Applications".

Some systems are now operated on harvested energy, in which case they may be active when power is available and then turn off when no power is available. Energy harvesting, also known as power harvesting or energy scavenging, is the process by which energy is derived from external sources, captured, and stored for small, wireless autonomous devices, such as those used in wearable electronics and wireless sensor networks. Harvested energy may be derived from various sources, such as: solar power, thermal energy, wind energy, salinity gradients and kinetic energy, etc. However, typical energy harvesters provide a very small amount of power for low-energy electronics. The energy source for energy harvesters may be present as ambient background and is available for use. For example, temperature gradients exist from the operation of a combustion engine; there is a large amount of electromagnetic energy in the environment because of radio and television broadcasting, etc.

System on Chip (SoC) is now a commonly used concept; the basic approach is to integrate more and more functionality into a given device. This integration can take the form of either hardware or solution software. Performance gains are traditionally achieved by increased clock rates and more advanced process nodes. Many SoC designs pair a microprocessor core, or multiple cores, with various peripheral devices and memory circuits.

BRIEF DESCRIPTION OF THE DRAWINGS

Particular embodiments in accordance with the invention will now be described, by way of example only, and with reference to the accompanying drawings.

Figure 1:
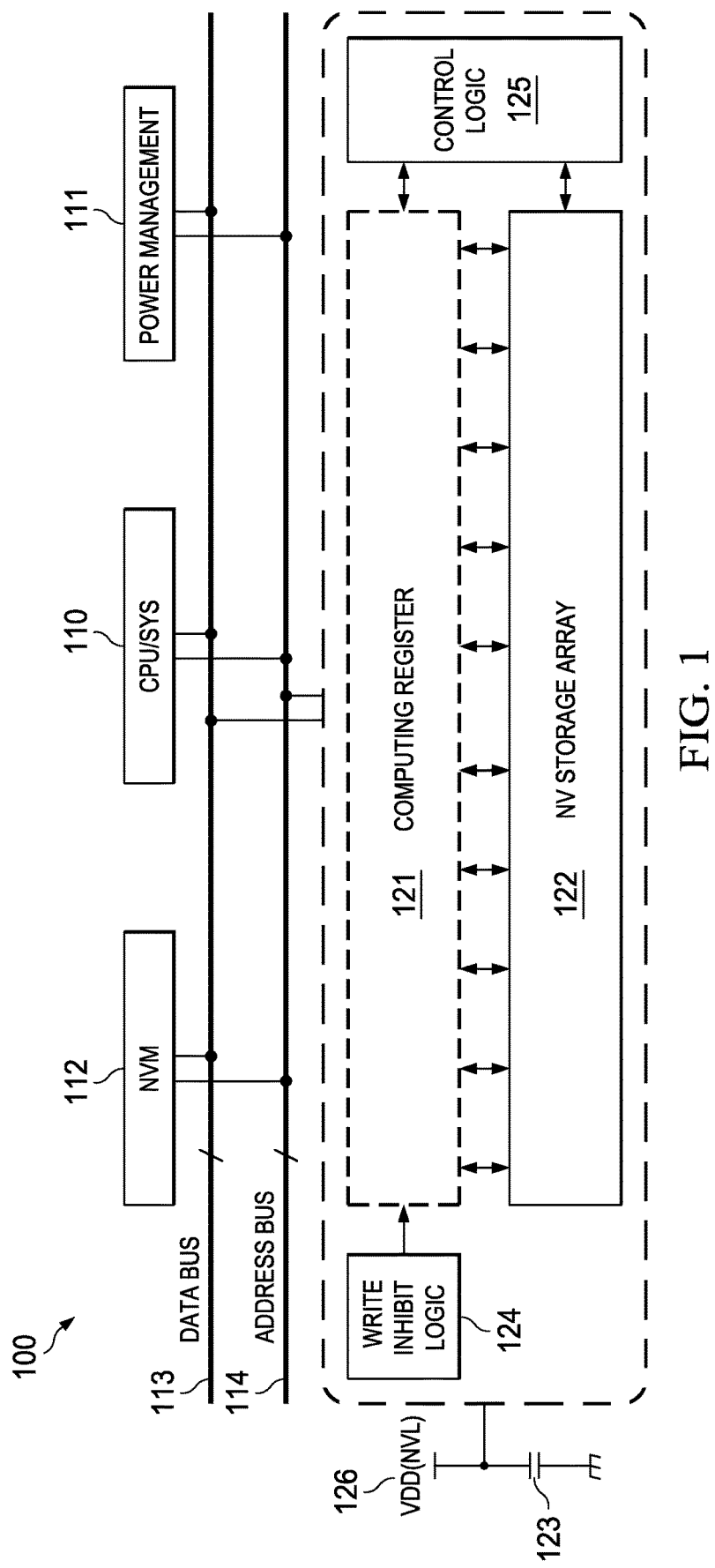
FIG. 1 is a block diagram of an example SoC which includes an embodiment of the invention.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In many systems there may be a need for a reliable mechanism for providing critical data that survives a partial or total power down, such as a random number used in an encryption application, a number of accesses used to limit access to a licensed application, etc., for example. Due to the critical nature of the critical data, the critical data must survive any power loss that may occur, or a power loss must be prevented. A power down may be intentionally triggered by a hacker, for example, to tamper with the application. Therefore, tamper protection may be used along with a high system level effort to avoid or react to a power down. Various embodiments of computing registers that may provide the types of data mentioned above may be configured to store their contents to a non-volatile backup storage in a non-disruptable atomic transaction each time the computing register is updated, as will be described in more detail below. In this manner, the critical data value may be preserved across power failure events so that operation of an application that uses the critical data value is not compromised in the event of normal or malicious power down events.

FIG. 1 is a functional block diagram of a portion of a system on chip (SoC) 100 that includes an embodiment of the invention. A system on chip (SoC) is described herein that includes one or more computing registers 121 that are coupled to nonvolatile bitcells 122. Each bit cell may include one or more ferroelectric capacitors configured to provide a non-volatile storage cell, for example. While prior art systems made use of retention latches to retain the state of flip-flops in logic modules during low power operation, some power is still required to retain state. Embodiments of the present invention may use nonvolatile elements to retain the state of flip flops while power is completely removed. Such logic elements will be referred to herein as Non-Volatile Logic (NVL).

Central processing unit (CPU) and system memory 110 may be implemented using various known or later developed CPU and memory architecture, such as various levels of cache and static, dynamic, and/or read only memory, for example. The CPU may be a known or later developed CPU type, such as a microprocessor, a digital signal processor, a reduced instruction set processor (RISC), etc., for example. Power management logic 111 may manage one or more power domains that may be controlled to selectively provide power to various sections of SoC 100 so that portions that are not being used may be powered down to conserve power, for example.

Non-volatile memory (NVM) 112 may be implemented using various known or later developed non-volatile technologies, such as Ferroelectric random access memory (FRAM), EEPROM (electrically erasable programmable read only memory), Flash memory, etc., for example. Ferroelectric random access memory is a non-volatile memory technology with similar behavior to DRAM (dynamic random access memory). Each individual bit can be accessed, but unlike EEPROM does not require a special sequence to write data nor does it require a charge pump to achieve required higher programming voltages. Each ferroelectric memory cell contains one or more ferroelectric capacitors (FeCap).

While the NVM 112 may be used to store critical data that is produced within the computing register, such as a random number or a counter value, storing the current critical value in non-volatile memory 112 would have to be done on a regular basis to represent the actual value and requires additional power and time. Furthermore, storing the critical data in memory 112 via data bus 113 could be a security issue. If SoC 100 undergoes a sudden power loss which happens before write-back of the actual value to the memory, the value might be lost or corrupted. In case it is lost, a previous value could be used twice which is typically undesired. Once SoC 112 recovers from a power loss, then additional steps would be required to restore the critical data from NVM 112.

In order to overcome the problems mentioned above, non-volatile computing logic 120 includes a computing register 121 that is coupled to an array of non-volatile (NV) storage cells 122 in a manner that allows the contents of computing register 121 to be stored directly into the NV cells 122 each time the contents of the computing register are updated. This is done in an atomic manner in response to updating register 121 which means that the update sequence cannot be interrupted or disrupted by a power failure event, for example. Computing register 121 may be implemented using a set of latches to form various types of computing functions, such as: an up-counter, a down-counter, an up/down counter, a shift register, a linear feedback shift register (LFSR), etc., for example. The latches may be in the form of various known or later developed storage cells, such as: a D-flip-flop, an RS flip-flop, a gated latch, sequential cells, etc., for example. The use of FRAM based NV storage cells may reduce power consumption as compared to other types of NV storage cells such as Flash or EEPROM, for example. The term "atomic NVL" will be used herein to refer to latches/flip-flops that are backed up atomically in NVL each time the state logic within the atomic NVL is accessed or otherwise triggered. The term "non-atomic NVL" will be used to refer to latches/flip-flops in which a state backup is only done in response to a pending power loss or controlled power down.

Atomic NVL 120 also includes fail safe power source 123 that is configured to provide enough energy to guarantee that the contents of computing register 121 may be successfully stored in NV storage array 122 each time the contents of computing register 121 is updated, even if all other power is removed from SoC 100 either in the normal course of operation or with malicious intent. During normal operation, atomic NVL 120 may receive power from a power supply 126 that provides power to the rest of SoC 100, such as a battery, a scavenger circuit, a solar cell, a connection to a wall outlet, etc., for example. In another embodiment, atomic NVL 120 may be powered by a separate power source VDD(NVL) from the rest of SoC 100, such as a second battery, scavenging resources, etc., for example. In yet another embodiment, atomic NVL 120 may be placed in a separate power domain VDD(NVL) that is powered by a same source as the rest of SoC 100. Switch transistors, or other types of isolation circuitry may be used to selectively turn on and off various power domains within SoC 100 in response to power management logic 111, for example. Known or later developed isolation gates and/or isolation level shifters may be provided to prevent cross-currents at the inputs of a powered domain, caused by floating logic that is in a power domain that is currently turned off.

Fail safe power source 123 may be in the form of a capacitor that is charged during normal operation of NVL 120. When power is removed from SoC 100, fail safe power supply 120 provides enough power to allow any pending update to NV storage 122 to be completed. Isolation circuitry, such as a diode or other electronic device may be provided to prevent power from fail-safe source 123 being dissipated on other circuitry outside of atomic NVL 120 during a general power loss, for example. Write inhibit logic 124 may be provided to record when a write or other initialization action has been performed on computing register 121. Write inhibit logic 124 may be in the form of a one bit counter to allow only one update, or in the form of a multibit counter to allow a limited number of write operations to initialize computing register 121. In some embodiments, computing register 121 may be addressed by CPU 110 via address bus 114 and provided with an initial data value via data bus 113. In other embodiments, computing register 121 may be initialized to an initial value during a production test phase, for example. In other embodiments, computing register 121 may be initialized to an initial value by a reset operation, for example. The write inhibit logic 124 may be initialized at production test to have a defined initial state when it leaves the factory. In this manner, initialization to random state may be avoided. Similar, a factory set initial value may be used to inhibit any writes in the field.

In this example, the state of write inhibit logic 124 is also atomically preserved in NV storage cells 122. In this manner, in a user application mode at each startup of the digital system, the sequential cell(s) of the write inhibit logic 124 may be restored from the NVL cells 122. In user application mode, a write to the computing register 121 may be allowed as long as the write inhibit logic 124 allows it. In this case, an atomic operation guarantees the value to the computing register 121 is set, the write inhibit logic 124 is updated, and both the computing register 121 and write inhibit logic value 124 are stored in the NV cells 122.

In another embodiment, write inhibit logic 124 may be omitted. In this case, computing register 121 may be initialized to a particular or random value during production testing, for example. In this example, further updates by a write from CPU 110 or a system reset is not permitted after the device leaves the factory.

In this example, control logic 125 may generate various timing and control signals needed for the operation of NV logic 120. Control logic 125 may also control an access interface between CPU 110 and computing register 121. During operation of SoC 100, an application being executed by CPU 110 may read a current value from computing register 121 using address bus 114 and data bus 113. The act of reading register 121 may trigger a computation update to register 121, such as a count, a shift, etc., depending on the computation function of computing computation register 121. In this case, a non-interruptible atomic transaction will guarantee that the computation update is completed and that the results of the computation are correctly stored in NV cells 122. That means that storage in NV cells 122 is done directly whenever a new value is generated by a read or other type access to register 121.

Similarly, in another embodiment, computing register 121 may be coupled to a dedicated logic function such as encryption logic that is configured to access the contents of computing register 121, rather than being accessed by CPU 110. In this case, the dedicated logic function may trigger a computation update and an atomic operation will guarantee that the computation update is completed and that the results of the computation are correctly stored in NV cells 122.

When power is removed from SoC 100 and then eventually reapplied, SoC 100 may go through a power up process, which may be referred to as a "reboot". During the power up process, the computing register 121 and write inhibit logic 124 will be restored to the last update value that was stored in NV storage 122.

As described above, in various embodiments the computing register 121 may be triggered to perform an update computation in various manners, such as: by reading the computing register 121 using normal CPU read operation; by performing a write cycle to a control register; by accessing the computation register by dedicated functional logic; by an external trigger; etc., for example. Note that in both the atomic update operation in which the updated value of computing register is stored in NV storage 122, and in the reboot process, the contents of the computing register need not be exposed on data bus 113. In this manner, malicious observation of the updated data value is prevented.

Figure 2:
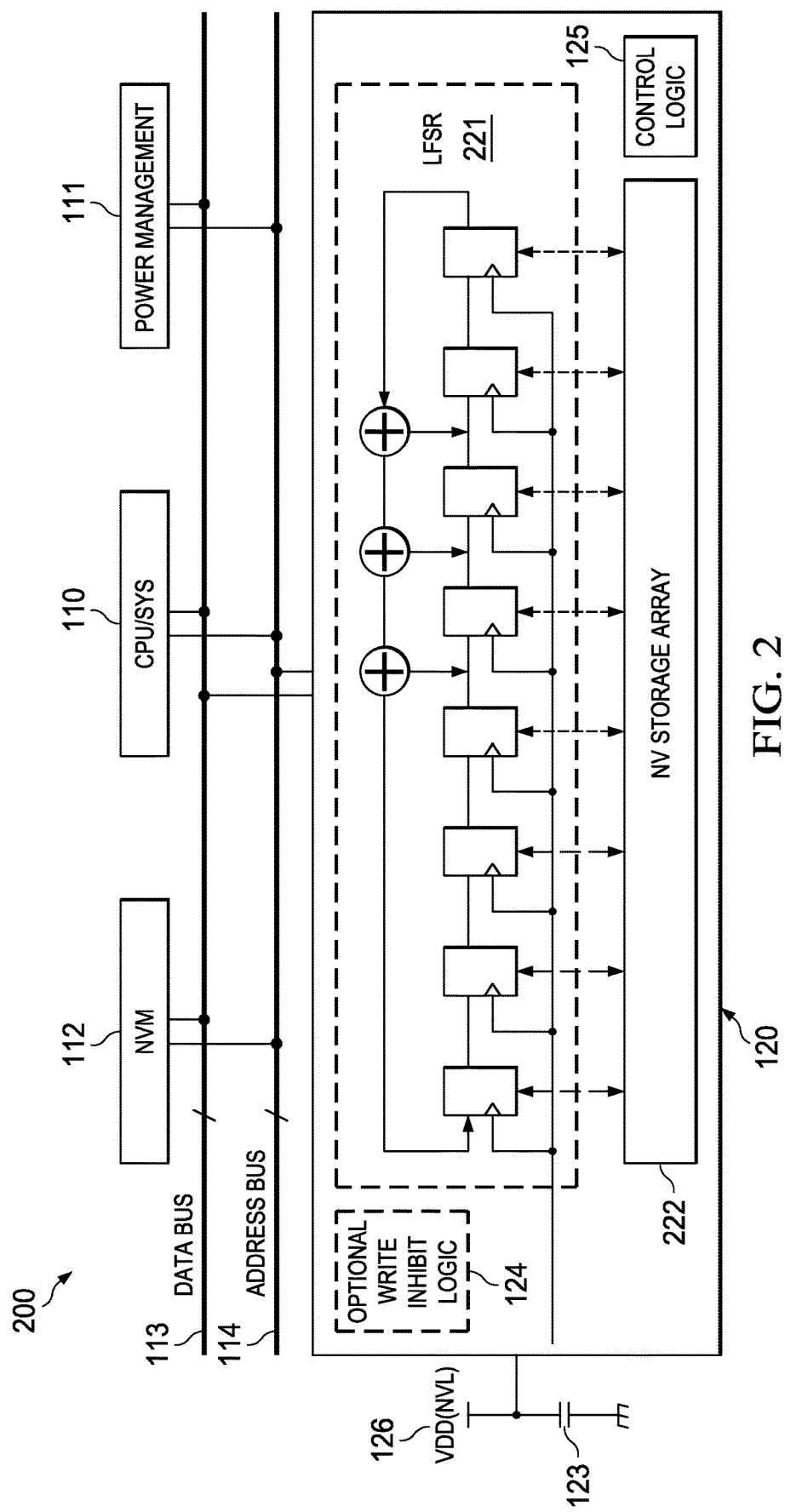
FIGS. 2 and 3 are more detailed block diagrams of embodiments of a non-volatile computing register for the SoC of FIG. 1.

FIG. 2 is a more detailed block diagram of an LFSR embodiment of a non-volatile computing register 221 for the SoC of FIG. 1. Linear Feedback Shift Registers (LFSR) cover various fields of application such as pseudo random number generation used for data encryption or digital signal processing, for example. An LFSR is based on the principle that the next read-out value is determined by right-shifting the previous value with XORs in the feedback (Fibonacci LFSR) or shift (Galois LFSR) path. Mathematically this represents a polynomial division. In order to achieve a maximum period, primitive polynomials are selected. A seed value initializes the LFSR. This is typically a true random number.

As discussed above, the seed value may be initialized during production testing, or initialization may occur in an application mode with the assistance of an optional write inhibit logic 124 to prevent more than one or a limited number of seed value updates.

As described above, in various embodiments LFSR computation register 221 may be triggered to perform an update computation in various manners, such as: by reading the LFSR computation register using normal CPU read operation; by performing a write cycle to a control register; by accessing the computation register by dedicated functional logic, by an external trigger, etc., for example. Note that in both the atomic update operation in which the updated value of computing register is stored in NV storage 222, and in the reboot process, the contents of the computing register need not be exposed on data bus 113. In this manner, malicious observation of the updated data value is prevented.

Figure 3:
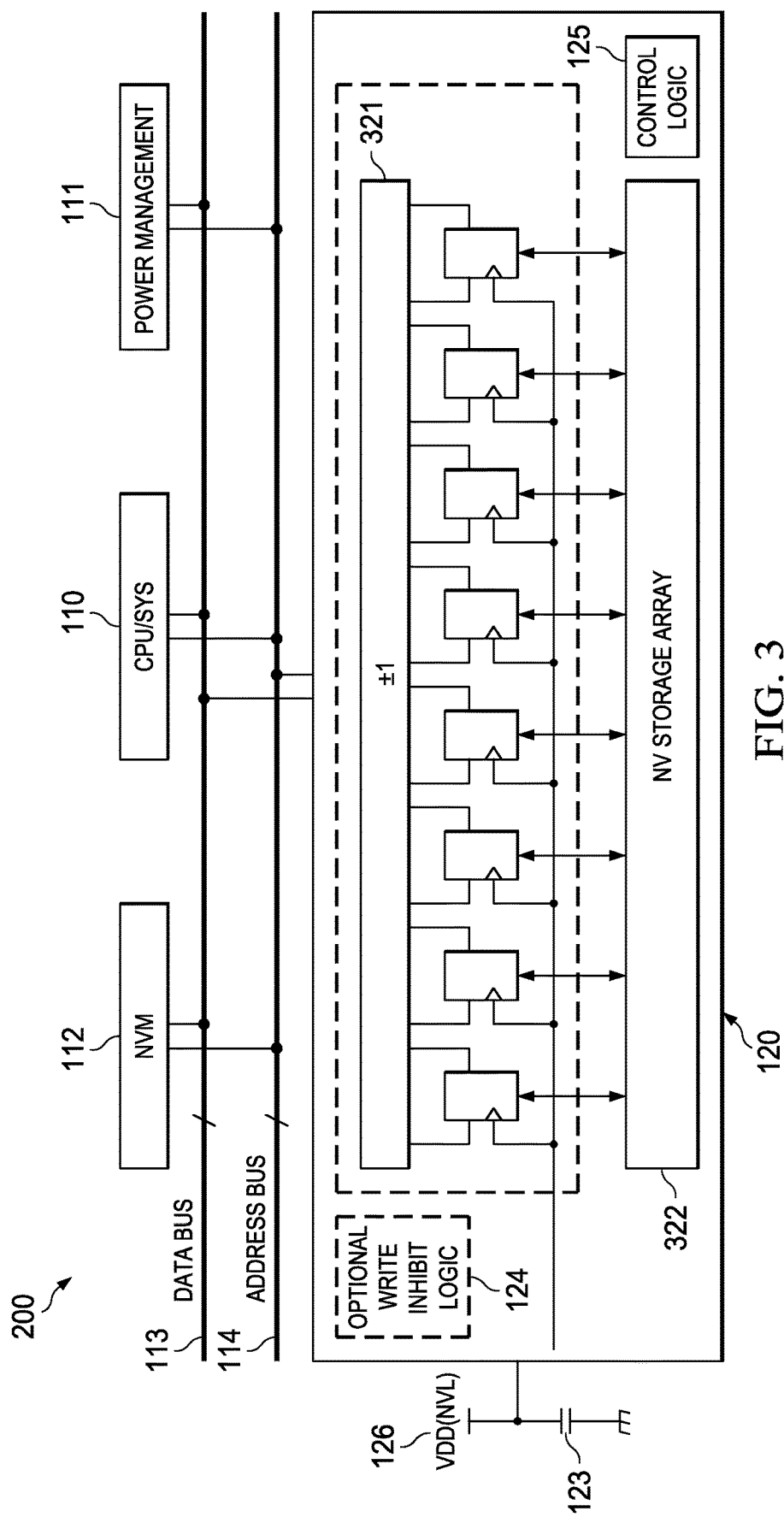

FIG. 3 is a more detailed block diagram of a counter embodiment of a nonvolatile computing register 321 for the SoC of FIG. 1. Hardware up, down or up/down counters may be used as part of an SoC, a micro-control unit (MCU), an application specific integrated circuit (ASIC), processors, etc., for example, to store the number of accesses to features or applications, in order to limit the maximum number of accesses to a specific application, for example.

As discussed above, the seed value may be initialized during production testing, or initialization may occur in a application mode with the assistance of an optional write inhibit logic 124 to prevent more than one or a limited number of seed value updates.

As described above, in various embodiments counter computation register 321 may be triggered to perform an update computation in various manners, such as: by reading the counter computation register using normal CPU read operation; by performing a write cycle to a control register; by accessing the computation register by dedicated functional logic; by an external trigger etc., for example. Note that in both the atomic update operation in which the updated value of computing register is stored in NV storage 322, and in the reboot process, the contents of the computing register need not be exposed on data bus 113. In this manner, malicious observation of the updated data value is prevented.

Figure 4:
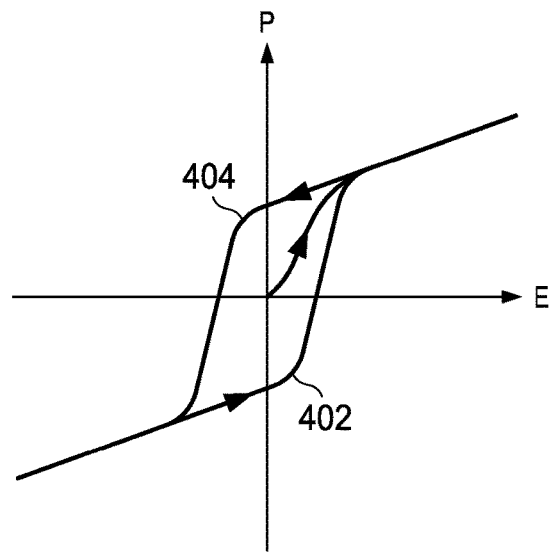
FIG. 4 is a plot illustrating polarization hysteresis exhibited by a ferroelectric capacitor.

FIG. 4 is a plot illustrating polarization hysteresis exhibited by a ferroelectric capacitor. The general operation of ferroelectric bit cells is known. When most materials are polarized, the polarization induced, P, is almost exactly proportional to the applied external electric field E; so the polarization is a linear function, referred to as dielectric polarization. In addition to being nonlinear, ferroelectric materials demonstrate a spontaneous nonzero polarization as illustrated in FIG. 4 when the applied field E is zero. The distinguishing feature of ferroelectrics is that the spontaneous polarization can be reversed by an applied electric field; the polarization is dependent not only on the current electric field but also on its history, yielding a hysteresis loop. The term "ferroelectric" is used to indicate the analogy to ferromagnetic materials, which have spontaneous magnetization and also exhibit hysteresis loops.

The dielectric constant of a ferroelectric capacitor is typically much higher than that of a linear dielectric because of the effects of semi-permanent electric dipoles formed in the crystal structure of the ferroelectric material. When an external electric field is applied across a ferroelectric dielectric, the dipoles tend to align themselves with the field direction, produced by small shifts in the positions of atoms that result in shifts in the distributions of electronic charge in the crystal structure. After the charge is removed, the dipoles retain their polarization state. Binary "0"'s and "1"'s are stored as one of two possible electric polarizations in each data storage cell. For example, in the figure a "1" may be encoded using the negative remanent polarization 402, and a "0" may be encoded using the positive remanent polarization 404, or vice versa.

Ferroelectric random access memories have been implemented in several configurations. A one transistor, one capacitor (1T-1C) storage cell design in a FeRAM array is similar in construction to the storage cell in widely used DRAM in that both cell types include one capacitor and one access transistor. In a DRAM cell capacitor, a linear dielectric is used, whereas in a FeRAM cell capacitor the dielectric structure includes ferroelectric material, typically lead zirconate titanate (PZT). Due to the overhead of accessing a DRAM type array, a 1T-1C cell is less desirable for use in small arrays such as NV storage array 122.

A four capacitor, six transistor (4C-6T) cell is a common type of cell that is easier to use in small arrays. One such cell is described in more detail in U.S. Pat. No. 8,797,783 "Four Capacitor Nonvolatile Bit Cell", Steven Craig Bartling, et al, granted Aug. 5, 2014, which is incorporated by reference herein.

Figure 5:
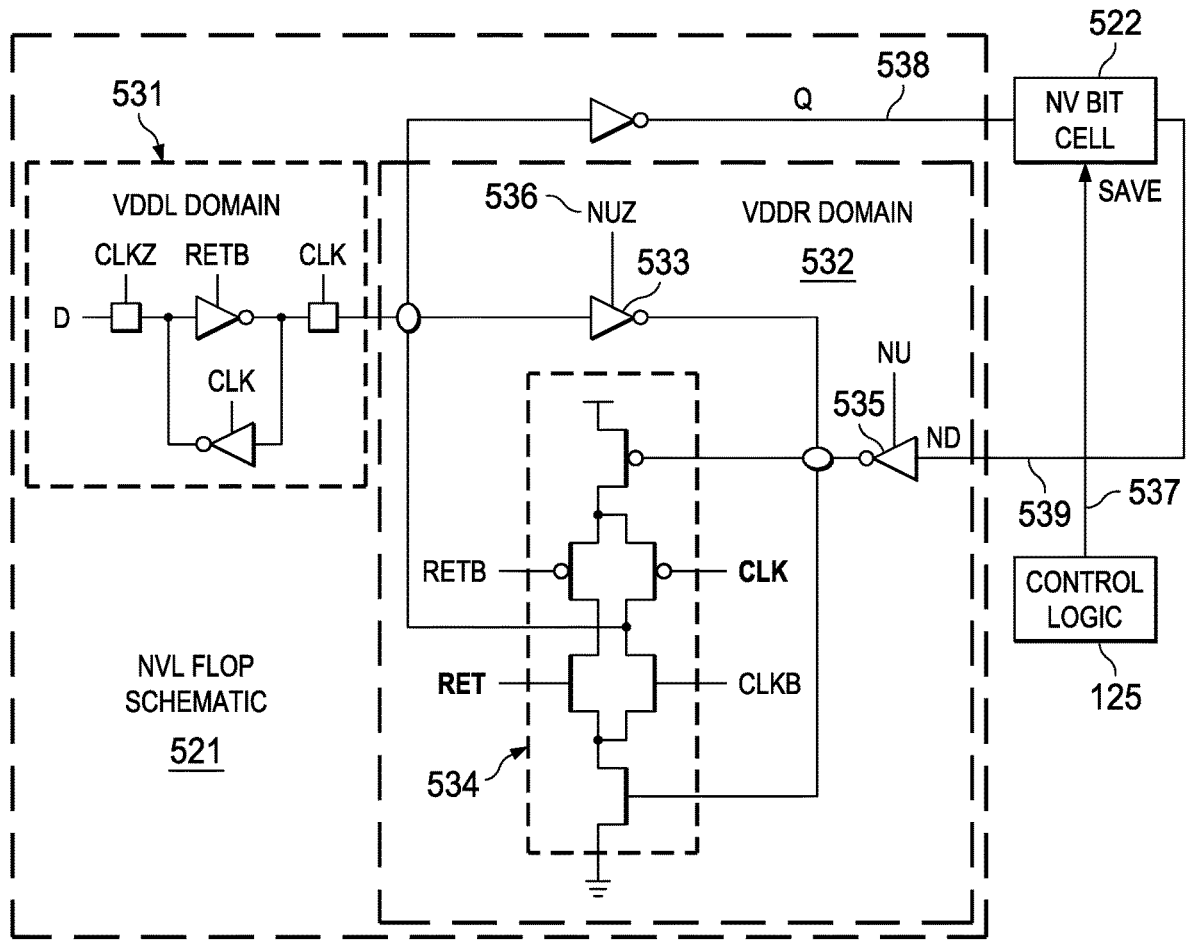
FIG. 5 is a more detailed circuit diagram of an embodiment of a non-volatile computing register.

FIG. 5 is a more detailed circuit diagram of a portion of a non-volatile computing register that may be used in FIGS. 1-3. Block 521 is a more detailed schematic of each latch bit that is used within the computing registers described above. In this example, each latch bit is implemented as a retention flip-flop that allows the SoC to be placed into a low power state in which data values are retained. Several of the signals have an inverted version indicated by suffix "B" (referring to "bar" or /), such as RET and RETB, CLK and CLKB, etc. Each retention FF includes a master latch 531 and a slave latch 532. Slave latch 532 is formed by inverter 533 and inverter 534. Inverter 534 includes a set of transistors controlled by the retention signal (RET, RETB) that may used to retain the FF state during low power sleep periods, during which a power domain VDDR remains on while a power domain VDDL is turned off.

NV bit cell 522 can be part of an NVL mini array described above, for example. To enable data transfer between NV bit cell 522 and FF 521, two additional ports are provided on the slave latch 532 of each FF as shown in block 521. An input for NVL data ND is provided by gate 535 that is enabled by an NVL update signal NU. Inverter 533 is modified to allow the inverted NVL update signal NUZ to disable the signal from master latch 531. When data from the NV bit cell is valid on the ND port, the NU (NVL-Update) control input is pulsed high for a cycle to write to the FF.

To save flip-flop state, the Q output 538 of each FF is connected to the data input of NV bit cell 522 and a save signal 537 is pulsed. As discussed above in more detail, the state of each latch in computing latch 121 is saved after each computation update in an atomic manner so that the update data is not lost in the event of a power fail. The save signal 537 may be triggered by control logic 125 each time the computation latch is updated, as described above.

To restore flip-flop state, control logic 125 pulses the NU signal for each flip-flop. During system restore, retention signal RET is held high and the slave latch is written from ND with power domain VDDL unpowered; at this point the state of the system clock CLK is a don't care. FF's may be placed in the retention state with VDDL=0V and VDDR=VDD in order to suppress excess power consumption. One skilled in the art can easily see that suitably modified non-retention flops can be used in NVL based SOC's at the expense of higher power consumption during NVL data recovery operations.

System clock CLK may start from an inactive state once VDDL comes up and thereafter normal synchronous operation continues with updated information in the FFs. Since a direct access is provided between the FFs 521 and NV array cells 522, intervention from a microcontroller processing unit (CPU) is not required for NVL operations; therefore the implementation is SoC/CPU architecture agnostic.

Figure 6:
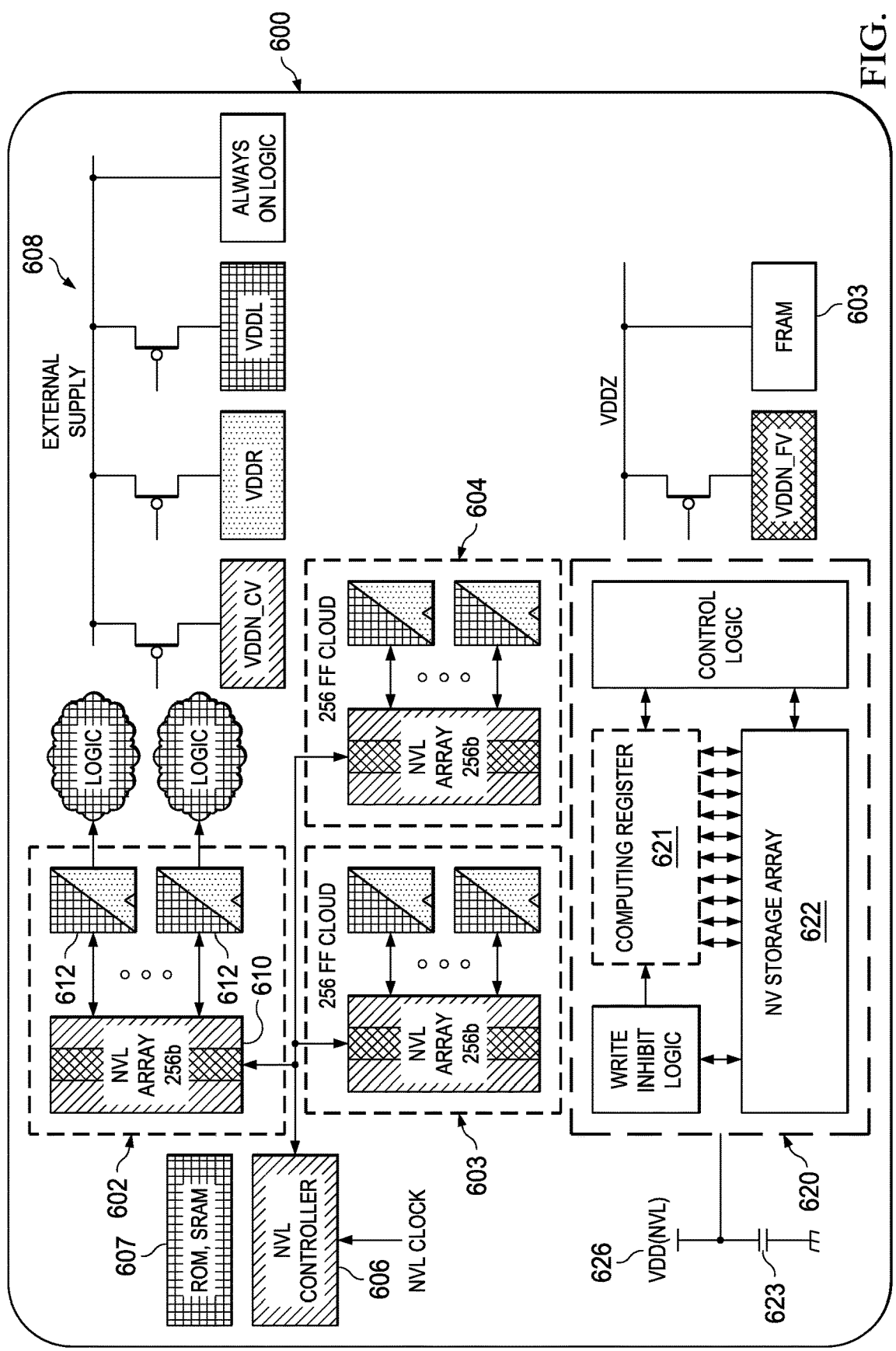
FIG. 6 is a functional block diagram of a portion of a system on chip (SoC) 100 that includes an embodiment of the invention.

FIG. 6 is a functional block diagram of a portion of a system on chip (SoC) 600 that includes an embodiment of the invention. In this example, a micro-control unit (MCU) such as CPU 110, may be implemented with NVL within an SoC (system on a chip) and may have the ability to stop, power down, and power up with no loss in functionality. A system reset/reboot is not required to resume operation after power has been completely removed. This capability is ideal for emerging energy harvesting applications, such as Near Field Communication (NFC), radio frequency identification (RFID) applications, and embedded control and monitoring systems, for example, where the time and power cost of the reset/reboot process can consume much of the available energy, leaving little or no energy for useful computation, sensing, or control functions. Though the present embodiment utilizes an SoC (system on chip) containing a programmable MCU for sequencing the SoC state machines, one of ordinary skill in the art can see that NVL can be applied to state machines hard coded into ordinary logic gates or ROM (read only memory), PLA (programmable logic array), or PLD (programmable logic device) based control systems, for example.

Without NVL, a chip would either have to keep all flip-flops powered in at least a low power retention state that requires a continual power source even in standby mode, or waste energy and time rebooting after power-up. For energy harvesting applications, NVL is useful because there is no constant power source required to preserve the state of flip-flops (FFs), and even when the intermittent power source is available, boot-up code alone may consume all the harvested energy. For handheld devices with limited cooling and battery capacity, zero-leakage IC's (integrated circuits) with "instant-on" capability are ideal.

An SoC may be implemented using the atomic NVL cells as described above to provide the benefit of non-volatile operation. However, using atomic NVL for all logic within an SoC may be more expensive in terms of chip area and power consumption than non-atomic NVL. Non-atomic NVL is a type of NVL in which the state of operating latches/flip-flops is transferred to the NV arrays when a power down event has been detected, or when only certain power domains are powered down to reduce energy usage. In this case, a certain amount of time and energy is required to transfer the state information to the NV storage. SoC 600 is an example of a mixed system in which atomic NVL may be used for encapsulated circuitry such as the computing register(s) 620 discussed above and non-atomic NVL may be used for the remaining logic such as the CPU, etc. Non-atomic NVL may be implemented using one or more arrays 610 of FeCap (ferroelectric capacitor) based bitcells to save state of the various flip flops 612 when power is removed. Each cloud 602-604 of FFs 612 may include an associated NVL array 610. A central non-atomic NVL controller 606 controls all the arrays and their communication with FFs 612. While three FF clouds 602-604 are illustrated here, SoC 600 may have additional, or fewer, FF clouds all controlled by NVL controller 606. This example non-atomic NVL array implementation uses 256 bit mini-arrays, but arrays may have a greater or lesser number of bits as needed.

In SoC 600, modified retention FFs 612 include simple input and control modifications to allow the state of each FF to be saved in an associated FeCap bit cell in NVL array 610 when the system is being transitioned to a power off state. When the system is restored, then the saved state is transferred from NVL array 610 back to each FF 612. In SoC 600, NVL arrays 610 and controller 606 are operated on an NVL power domain referred to as VDDN and are switched off during regular operation. All logic, memory blocks 607 such as ROM (read only memory) and SRAM (static random access memory), and master stage of FFs are on a logic power domain referred to as VDDL. FRAM (ferroelectric random access memory) arrays are directly connected to a dedicated global supply rail (VDDZ) that may be maintained at a higher fixed voltage needed for FRAM. In a typical embodiment, VDDZ is a fixed supply and VDDL can be varied as long as VDDL remains at a lower potential than VDDZ. Note that FRAM arrays 603 may contain integrated power switches that allow the FRAM arrays to be powered down as needed. However, it can easily be seen that FRAM arrays without internal power switches can be utilized in conjunction with power switches that are external to the FRAM array. The slave stages of retention FFs are on a retention power domain referred to as the VDDR domain to enable regular retention in a stand-by mode of operation.

State info could be saved in a large centralized FRAM array, but would require more time to enter sleep mode, longer wakeup time, excessive routing, and power costs caused by the lack of parallel access to system FFs.

An embodiment of the invention may be included within SoC 600 to provide an atomic non-volatile computing module 620 that includes a computing register 621 directly coupled to a non-volatile storage array 622. As described in more detail above with regard to FIGS. 1-5, each time a computation update is triggered in computation register 621, an atomic operation will guarantee that the computation update is completed and that the results of the computation are correctly stored in NV cells 622. In some embodiments, NV storage array 622 is the same or similar to storage arrays 610. In other embodiments, there may be a difference in the organization or access interface, for example.

This is in contrast to prior art systems in which a state is saved to a non-volatile memory or array, such as FRAM, Flash, EEPROM, or non-atomic NVL, is only performed when a power down is in progress. In prior art systems, a malicious attempt to hack a system by performing an incorrect power down sequence or by causing a power failure in the system may prevent writing back the computing register's actual data to the NVM. In these systems, the implementation of a failsafe power source requires high system level efforts. Furthermore, in prior art systems, a typical malicious attempt to hack the sensitive data is to manipulate the data on the system data or address bus while it is transferred to the NVM. However, since computing register 621 is directly coupled to NV storage array 622 and is backed up every time the computing register is updated by an atomic operation, as described in more detail above, the sensitive data that may be stored in computing register 621 will not be manipulated by malicious attempts.

During normal operation, atomic NVL 620 may receive power from a power supply 626 that provides power to the rest of SoC 600, such as a battery, a scavenger circuit, a solar cell, a connection to a wall outlet, etc., for example. In another embodiment, atomic NVL 620 may be powered by a separate power source VDD(NVL) from the rest of SoC 600, such as a second battery, scavenging resources, etc., for example. In yet another embodiment, atomic NVL 620 may be placed in a separate power domain VDD(NVL) that is powered by a same source as the rest of SoC 600. In this case, switch transistors 608 or other types of isolation circuitry may be used to selectively turn on and off various power domains within SoC 600 in response to power management logic. For example, there may be a control voltage domain VDDN_CV for the NVL control logic, a retention voltage domain VDDR, a general logic domain VDDL, and a FRAM domain VDDN_FV, for example. Known or later developed isolation gates and/or isolation level shifters may be provided to prevent cross-currents at the inputs of a powered domain, caused by floating logic that is in a power domain that is currently turned off.

Figure 7:
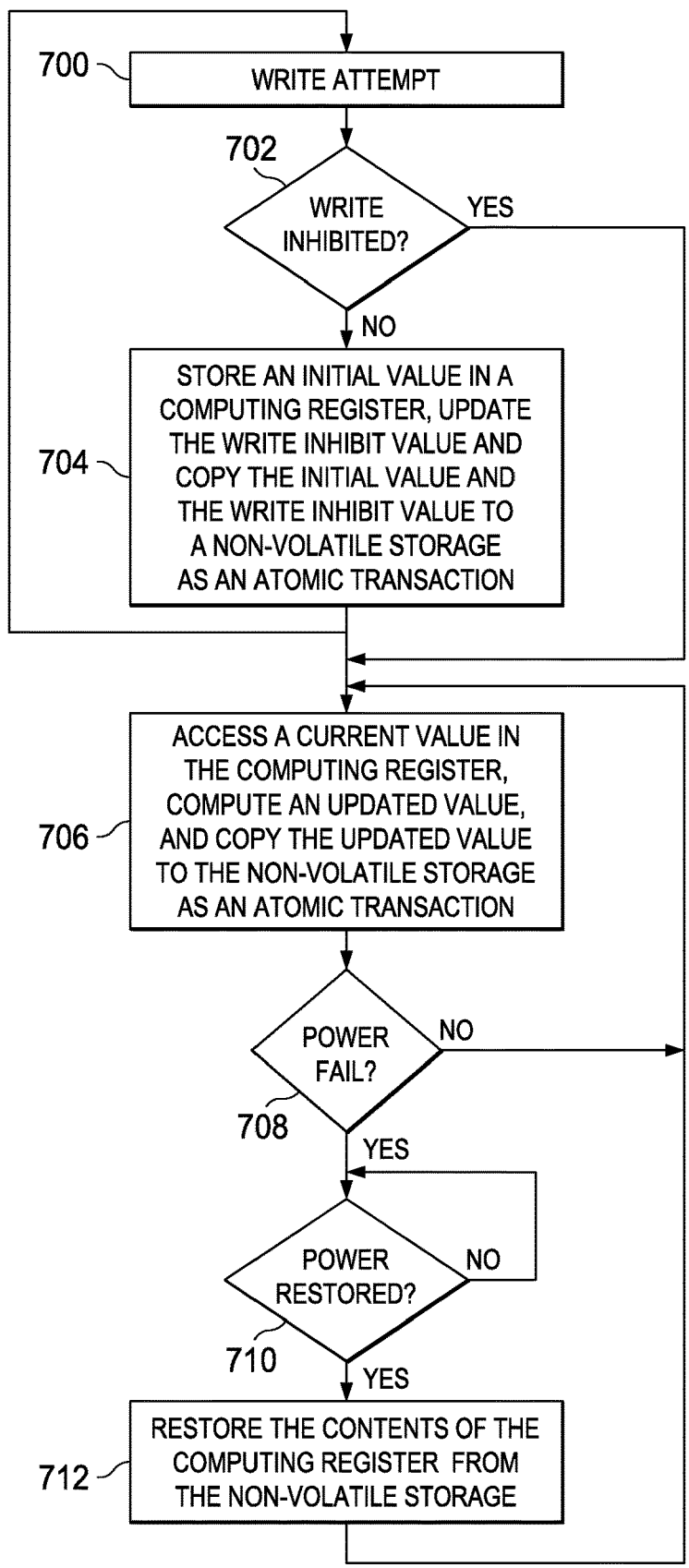
FIG. 7 is a flow chart illustrating operation of a non-volatile computing circuit that performs atomic backup transactions.

FIG. 7 is a flow chart illustrating operation of a non-volatile computing circuit that performs atomic backup transactions. A digital system may be provided with a non-volatile computing circuit such as described with regards to FIGS. 1-3, such as: an up-counter, a down-counter, an up/down counter, a shift register, a linear feedback shift register (LFSR), etc., for example. At some point in time, an initial value may be stored 704 in the computing circuit. As described above in more detail, this may be performed during production testing or during operation in an application environment, for example. The initial value is copied to a non-volatile storage array as an atomic transaction.

During the course of operation, accesses 706 may be made to the computing circuit by a processing unit or other accessing module that may be coupled to the computing circuit. Each time the computing circuit is accessed, a computation may be triggered to cause an updated value to be computed and copied into the non-volatile storage array as an atomic transaction. As discussed above in more detail, embodiments of the computation register maybe triggered to perform an update computation in various manners, such as: by reading the computation register using normal CPU read operation; by performing a write cycle to a control register; by accessing the computation register by dedicated functional logic; by an external trigger, etc., for example.

Accessing, computing and copying to non-volatile storage may continue until a power failure 708 occurs. Since the contents of the computing register are atomically copied to the non-volatile storage each time the computing register is triggered, nothing needs to be done to preserve data when a power failure occurs.

Once power is restored 710, the contents of the computing register may be restored from the non-volatile storage and operation may then continue as if power was never lost. In another implementation, restoring of the computing register from the NVL storage 712 is part of the atomic transaction 706. In this implementation, the data is restored from the NVL storage to the computing register each time the atomic transaction is initiated.

In some embodiments, a write inhibit circuit may be provided to prevent more than a limited number of initializations. In this case, when a write attempt 700 is made, only the first initialization write transaction 700 or first limited number of initialization write transactions 700 will be permitted 704. Additional write attempts beyond the specified limit will be inhibited 702.

In an embodiment that does not provide a write inhibit circuit, the computing circuit may be configured to only be initialized during production testing, for example. In other embodiments that do not provide a write inhibit circuit, write access to the computing circuit may be controlled using software or other security measures, for example.

Thus, embodiments of the invention may include a non-volatile computing logic such as a LFSR or a counter in which a critical data value may be computed and stored in NVL based flip-flops which retain the actual value even after a power-down. Generation of new LFSR/counter values and storage in NVL cells is done as non-disruptable atomic operation. Even on a sudden power loss the operation may be completed using power from a sufficiently sized fail safe power supply, such as an internal supply capacitor. Automatic recovery of the actual LFSR/counter value into the LFSR/counter flops may be performed after power up following a power down or power loss or as part of the atomic transaction. In this manner, increased security is provided since sensitive infrastructure such as a system data bus is not required to reinitialize the current value. Furthermore, increased security is provided since the generation and the NV storage of a new LFSR/counter value is an atomic operation. This allows reduced recovery time and energy compared to a reinitialization from memory.

Other Embodiments

Although the invention finds particular application to microcontrollers (MCU) implemented, for example, in a System on a Chip (SoC), it also finds application to other forms of processors and integrated circuits. A SoC may contain one or more modules which each include custom designed functional circuits combined with pre-designed functional circuits provided by a design library, for example.

While the invention has been described with reference to illustrative embodiments, this description is not intended to be construed in a limiting sense. Various other embodiments of the invention will be apparent to persons skilled in the art upon reference to this description. For example, other portable, or mobile systems such as remote controls, access badges and fobs, smart credit/debit cards and emulators, smart phones, digital assistants, and any other now known or later developed portable or embedded system may embody an atomic non-volatile computing module as described herein to allow updating and storing critical data that may be immune from attempts by hacking to reveal or corrupt the critical data. Other embodiments may use FRAM based atomic NVL to implement portions of circuitry in order to reduce power consumption, as opposed to other NV technologies such as Flash or EEPROM, for example.

While embodiments of retention latches coupled to a nonvolatile FeCap bitcell are described herein, in another embodiment, a nonvolatile FeCap bitcell from an NVL array may be coupled to a flip-flop or latch that does not include a low power retention latch. In this case, the system would transition between a full power state, or otherwise reduced power state based on reduced voltage or clock rate, and a totally off power state, for example. A computation update and an atomic operation will guarantee that the computation update is completed and that the results of the computation are correctly stored in NV cells coupled to the latch bits. When power is restored, the latches would be initialized via an input provided by the associated NV array bitcell.

While embodiments are described herein in which the state of atomic NVL circuits is restored in response to a power up event, in other embodiments there may be additional or different restore events that may cause the state of the atomic NVL circuits to be restored, such as: in response to a reset signal or command, in response to an explicit restore command from the CPU or other control logic, in response to doing a calculation, etc., for example.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A digital system comprising:
 a processor;
 a computing register having a plurality of latches coupled to perform a calculation of a next value, wherein the plurality of latches of the computing register are coupled to the processor by a first data bus;
 a plurality of non-volatile storage cells coupled to the plurality of latches by a second data bus that is separate from the first data bus;
 access detection logic coupled to the computing register, wherein the access detection logic is operable to:
  initiate the calculation of the next value by the computing register each time the computing register is accessed by an accessing module via the first data bus; and
  cause the next value to be written to the plurality of non-volatile storage cells via the second data bus at the completion of the calculation as an atomic transaction, wherein the next value is not accessible by the first data bus when being written to the plurality of non-volatile storage cells via the second data bus during the atomic transaction; and
 write inhibit logic coupled to the computing register, wherein the write inhibit logic is operable to prevent the computing register from being written to more than a number of times.

2. The digital system of claim 1, further comprising a failsafe power source coupled to the computing register and to the plurality of non-volatile storage cells, wherein the failsafe power source has sufficient power storage to allow the computing register to complete a calculation and to store the resultant next value in the plurality of non-volatile storage cells, and wherein the failsafe power source comprises a precharged capacitor.

3. The digital system of claim 1, wherein each of the plurality of latches includes:
a first latch that includes an input and an output; and
a second latch that includes a first input coupled to the output of the first latch, wherein the first latch is supplied by a first power domain and the second latch is supplied by a second power domain that is independent of the first power domain.

4. The digital system of claim 3, wherein the first power domain is configured to be off in a low power mode and the second power domain is configured to be on in the low power mode.

5. The digital system of claim 3, wherein each of the plurality of latches includes an inverter coupled between the output of the first latch and a respective cell of the plurality of non-volatile storage cells.

6. The digital system of claim 3, wherein the second latch of each of the plurality of latches includes a second input coupled to a respective cell of the plurality of non-volatile storage cells.

7. The digital system of claim 1, wherein the computing register is a linear feedback shift register.

8. The digital system of claim 1, wherein the computing register is a counter.

9. The digital system of claim 1, wherein the non-volatile storage cells are ferroelectric storage cells.

10. The digital system of claim 1, further comprising control logic coupled to detect a restore event and to cause the contents of the computing register to be restored from the plurality of non-volatile storage cells.

11. The digital system of claim 10, wherein the restore event is a power up event.

12. A method for operating a digital system, the method comprising:
storing an initial data value in a computing register;
updating the initial data value stored in the computing register to a current data value in response to the computing register being accessed through a first data bus by an operation initiated by a processor of the digital system, wherein the first data bus couples the computing register to the processor;
in response to the initial data value being updated to the current data value, performing an atomic write operation to transfer the current data value from the computing register to a non-volatile cell array by a second data bus that couples the computing register to the non-volatile cell array and is separate from the first data bus; and
preventing another write to the computing register after writing to the computing register a number of times.

13. The method of claim 12, further comprising providing a failsafe power source that has sufficient power storage to allow the computing register to complete a calculation and to perform an atomic write operation to transfer the current data value from the computing register to a non-volatile cell array, wherein the failsafe power source comprises a precharged capacitor.

14. The method of claim 12, further comprising detecting a restore event and causing the contents of the computing register to be restored from the non-volatile cell array.

15. The method of claim 14, wherein the restore event is a power up event.

16. A digital system comprising:
a processor;
a computing register having a plurality of latches coupled to perform a calculation of a next value, wherein the plurality of latches of the computing register are coupled to the processor by a first data bus;
a plurality of non-volatile storage cells coupled to the plurality of latches by a second data bus that is separate from the first data bus; and
access detection logic coupled to the computing register, wherein the access detection logic is operable to:
initiate the calculation of the next value by the computing register each time the computing register is accessed by an accessing module via the first data bus; and
cause the next value to be written to the plurality of non-volatile storage cells via the second data bus at the completion of the calculation as an atomic transaction;
wherein:
the next value is not accessible by the first data bus when being written to the plurality of non-volatile storage cells via the second data bus during the atomic transaction;
each of the plurality of latches of the computing register is coupled to a respective one of the plurality of non-volatile storage cells by the second data bus;
each latch comprises:
a master latch portion having an output; and
a slave latch portion having a first input port coupled to the output of the master latch portion and a second input port coupled to the respective non-volatile storage cell;
the master latch portion and the slave latch portion are supplied by separate independently controlled power domains of the digital system;
the slave latch portion includes an inverter having:
first and second switches connected in series and controlled by a retention signal; and
third and fourth switches connected in series and controlled by a clock signal supplied to the latch; and
the first and second switches are arranged in parallel with the third and fourth switches.

17. The digital system of claim 16, wherein:
the first, second, third, and fourth transistors are MOSFET transistors;
the first and second MOSFET transistors are of opposite conductivity types and are controlled by the retention signal and its complement, respectively; and
the third and fourth MOSFET transistors are of opposite conductivity types and are controlled by the clock signal and its complement, respectively.

* * * * *